(12) United States Patent
Suzuki

(10) Patent No.: US 6,794,692 B2
(45) Date of Patent: Sep. 21, 2004

(54) SOLID-STATE IMAGE PICK-UP DEVICE

(75) Inventor: Nobuo Suzuki, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/656,168

(22) Filed: Sep. 8, 2003

(65) Prior Publication Data

US 2004/0046883 A1 Mar. 11, 2004

(30) Foreign Application Priority Data

Sep. 9, 2002 (JP) ........................................ 2002-262835

(51) Int. Cl.[7] ...................... H01L 27/148; H01L 29/768
(52) U.S. Cl. ..................... 257/232; 257/233; 257/240; 257/241
(58) Field of Search ............................... 257/231, 232, 257/233, 240, 241

(56) References Cited

U.S. PATENT DOCUMENTS 4,602,289 A * 7/1986 Sekine ........................ 348/315
5,274,476 A * 12/1993 Lee ............................. 358/483
6,528,831 B2 * 3/2003 Umetsu et al. .............. 257/233

FOREIGN PATENT DOCUMENTS

JP          5-291552 A          11/1993

* cited by examiner

*Primary Examiner*—Ngân V. Ngô
(74) *Attorney, Agent, or Firm*—Birch, Stewart, Kolasch & Birch, LLP.

(57) ABSTRACT

In a solid-state image pick-up device of FIG. 1, a plurality of photoelectric converting devices 100 having almost square light receiving regions are provided like a tetragonal grid over the surface of a semiconductor substrate and a plurality of vertical transfer sections 200 are provided corresponding to the respective photoelectric converting device strings respectively. The vertical transfer section 200 includes a vertical transfer channel and a plurality of vertical transfer electrodes provided on the upper layer of the vertical transfer channel, and the vertical transfer channel is provided in winding shape between the photoelectric converting devices 100 constituting the corresponding photoelectric converting device strings.

9 Claims, 7 Drawing Sheets

SOLID-STATE IMAGE PICK-UP DEVICE

This nonprovisional application claims priority under 35 U.S.C. §119(a) on Patent Application No. 2002-262835 filed in Japan on Sep. 9, 2002, which is herein incorporated by reference.

BACKGROUND OF THE INVENTION

1. Field of the Invention

The present invention relates to a solid-state image pick-up device including a plurality of photoelectric converting devices provided like a tetragonal grid in a row direction and a column direction orthogonal thereto over the surface of a semiconductor substrate.

2. Description of the Related Art

A solid-state image pick-up device to be utilized for a digital camera detects a charge corresponding to an image signal by means of a photoelectric converting device. For this reason, in general, it is hard to widen a dynamic range. In order to obtain an image in a wide dynamic range, it is necessary to increase the amount of charges to be detected by the photoelectric converting device. For this purpose, it is necessary to increase the light receiving area of the photoelectric converting device. When the amount of the charges to be detected is increased, however, it is necessary to increase a transfer capacity, that is, a dimension of a charge transfer section. Consequently, there is a problem in that the number of pick-up images cannot be increased.

FIG. 11 shows a schematic structure according to an example of a conventional solid-state image pick-up device. The solid-state image pick-up device in FIG. 11 serves to convert a light intensity into a charge signal by a plurality of photoelectric converting devices 10 provided like a tetragonal grid, and a detected signal charge is transferred to an output section 40 through a plurality of vertical transfer sections 20 (In FIG. 11, one vertical transfer section is surrounded in a broken line) and a horizontal transfer section 30 and a voltage signal 41 corresponding to the signal charge is output from the output section 40.

The vertical transfer section 20 serves to transfer charges from the photoelectric converting devices 10 in a column direction Y and includes a plurality of vertical transfer channels (not shown) formed on a semiconductor substrate, a plurality of vertical transfer electrodes 101 to 104 formed on the upper layers of the vertical transfer channels, and a charge reading region 21 for reading the charges of the photoelectric converting devices 10 onto the vertical transfer channels (which are typically shown in an arrow of FIG. 11).

The vertical transfer channels take an almost straight shape extended in the column direction Y toward the side of the photoelectric converting devices 10, and a region for storing and transferring the charge is partitioned by the vertical transfer electrodes 101 to 104 formed on upper layers thereof. Two vertical transfer electrodes 101 to 104 are provided corresponding to the respective photoelectric converting devices 10 (only any of them corresponding to the photoelectric converting devices for two rows has the designation in FIG. 11) and the vertical transfer electrodes having the same positional relationship with the photoelectric converting devices for the same row are electrically connected through electrode wirings 121 and 122. The vertical transfer electrodes 101 to 104 are formed of poly-crystalline silicon.

Vertical transfer pulses having four phases are applied to the vertical transfer electrodes 101 to 104 through terminals 11 to 14 and the charges of the vertical transfer channels are transferred in the column direction Y. The vertical transfer pulse is also applied to transfer electrodes 105, 106 and 107 between the vertical transfer section 20 and the horizontal transfer section 30, and the charges for one row which are detected by the photoelectric converting devices 10 for an odd row or the photoelectric converting devices 10 for an even row are sent to the horizontal transfer section 30. The reading operation of the photoelectric converting devices 10 for the odd row is carried out by superposing a reading pulse on a first-phase pulse to be applied immediately before the start of a vertical charge transfer (a vertical transfer pulse to be applied to the terminal 11), and the reading operation of the photoelectric converting devices 10 for the even row is carried out by superposing a reading pulse on a third-phase pulse to be applied immediately after the start of the vertical charge transfer (a vertical transfer pulse to be applied to the terminal 13).

The horizontal transfer section 30 serves to transfer a charge from the vertical transfer section 20 in a row direction X and includes a horizontal transfer channel and a horizontal transfer electrode (which are not shown). Horizontal transfer pulses having two phases are applied to the horizontal transfer electrode through terminals 131 and 132 and the signal charges of the photoelectric converting devices 10 for one row which are sent from the vertical transfer section 20 are transferred to the output section 40.

Next, description will be given to the driving operation of the solid-state image pick-up device shown in FIG. 11. Referring to charges stored in the photoelectric converting device 10 corresponding to the intensity of a light incident from a field, first of all, the charges stored in the photoelectric converting devices 10 for the odd row are read onto the vertical transfer channel in response to the reading pulse to be superposed on the first-phase vertical transfer pulse. Then, the charges are transferred in the vertical transfer channel in response to the vertical transfer pulse and are held in the predetermined region of the horizontal transfer channel. Subsequently, when the horizontal transfer pulse is applied, the held charges for one row are sequentially sent to the output section 40 and the voltage signal 41 corresponding to the amount of the charges is output. After such a transfer processing is carried out for all of the photoelectric converting devices 10 for the odd rows, a reading pulse is superposed on the third-phase vertical transfer pulse to read the charges stored in the photoelectric converting devices 10 for the even rows onto the vertical transfer channel, thereby carrying out the same transfer.

In the conventional solid-state image pick-up device shown in FIG. 11, a region between the photoelectric converting devices in a vertical direction is utilized as the wiring path of the vertical transfer electrode and an image pick-up device is a useless region. More specifically, the ratio of the area of the photoelectric converting device to play a part in light concentration and charge storage and the area of the vertical transfer channel to play a part in the transfer of a signal charge to an area per pixel has an upper limit. For this reason, it is hard to raise the sensitivity of a pick-up image and a saturation voltage.

When the amount of the signal charge to be detected by the photoelectric converting device is increased, however, it is necessary to increase the channel width of the charge transfer channel. Conventionally, the charge transfer channel is provided on only the side of the photoelectric converting device. Consequently, the light receiving region of the photoelectric converting device becomes rectangle-shaped. In general, a microlens is provided for the light concentration above the photoelectric converting device 10. If the shape of the light receiving region is rectangular, it is hard to concentrate an incident light in the photoelectric converting device by means of the microlens. Consequently, there is a problem in that shading is increased, resulting in a remarkable reduction in the sensitivity with a small F value.

Patent Document JP-A-5-291552 has described a solid-state image pick-up device in which a charge transfer section has a winding shape between photoelectric converting devices to enlarge a dynamic range. In this solid-state image pick-up device, the photoelectric converting device is to be provided in winding shape, and furthermore, the shape of the vertical transfer section is varied between the adjacent photoelectric converting device strings. Accordingly, there is a problem in that it is hard to cause characteristics to be coincident with each other and an unevenness is apt to be generated in an image pick-up signal which is obtained.

SUMMARY OF THE INVENTION

The invention has been made in consideration of the circumstances and has an object to provide a solid-state image pick-up device having such a simple structure that the ratio of the areas of a photoelectric converting device and a vertical transfer channel to the area of a whole image pick-up section can be increased to obtain a great saturation output with a high sensitivity.

The invention provides a solid-state image pick-up device having a plurality of photoelectric converting devices arranged like a checker board in a row direction and a column direction orthogonal thereto over a surface of a provided corresponding to a plurality of photoelectric converting device strings having the photoelectric converting devices arranged in the column direction respectively and serving to transfer a charge of the photoelectric converting device in the column direction, a horizontal transfer section for transferring the charge from the vertical transfer section in the row direction, and an output section for outputting a signal corresponding to the charge to be transferred by the horizontal transfer section, wherein the vertical transfer section includes a vertical transfer channel and a plurality of vertical transfer electrodes provided on an upper layer of the vertical transfer channel, the vertical transfer channel is provided in winding shape between the photoelectric converting devices constituting the corresponding photoelectric converting device string, the vertical transfer electrode includes a first vertical transfer electrode having a first conductive layer formed on the upper layer of the vertical transfer channel between the photoelectric converting devices and a second vertical transfer electrode having a second conductive layer formed on the upper layer of the vertical transfer channel on a side of the photoelectric converting device, and the first vertical transfer electrode and the second vertical transfer electrode corresponding to the photoelectric converting devices for the same row are driven in response to driving signals having the same phase, respectively.

According to such a solid-state image pick-up device, the almost whole periphery of the photoelectric converting device can be utilized as the vertical transfer channel. Consequently, it is possible to increase the areas of the photoelectric converting device and the vertical transfer channel to the area of the whole image pick-up section, thereby obtaining a great saturation output with a high sensitivity.

In the solid-state image pick-up device according to the invention, the vertical transfer channel is formed with the same arrangement and shape for the photoelectric converting device strings. With such a structure, the charge transfer characteristic of the vertical transfer section can be made uniform so that even image data can be obtained easily.

In the solid-state image pick-up device according to the invention, a charge reading region for reading the charge of the photoelectric converting device onto the vertical transfer channel is formed in contact with the vertical transfer channel on the side of the photoelectric converting device.

In the solid-state image pick-up device according to the invention, moreover, a charge reading region for reading the charge of the photoelectric converting device onto the vertical transfer channel is formed in contact with the vertical transfer channel between the photoelectric converting devices.

Furthermore, the charge reading region for reading the charge of the photoelectric converting device onto the vertical transfer channel is formed in contact with the vertical transfer channel between the photoelectric converting devices, and a position of the charge reading region with respect to the photoelectric converting device is identical for each of the photoelectric converting device strings and the positions of the photoelectric converting device strings which are adjacent to each other are different from each other. According to the solid-state image pick-up device, the charges of the photoelectric converting devices in the checked position can be read at the same time so that uniform thinning reading can be carried out.

In addition, two kinds of collecting microlenses having different collection ratios are provided corresponding to each of the photoelectric converting devices, and the two kinds of microlenses are provided like a checker, respectively. With such a structure, it is possible to separately output a detection signal for a high-sensitivity pixel and a detection signal to be a low-sensitivity pixel signal which are arranged in checked positions, respectively.

The invention provides a solid-state image pick-up device having a plurality of photoelectric converting devices arranged like a tetragonal grid in a row direction and a column direction orthogonal thereto over a surface of a semiconductor substrate, comprising a plurality of vertical transfer sections provided corresponding to a plurality of photoelectric converting device strings having the photoelectric converting devices arranged in the column direction respectively and serving to transfer a charge of the photoelectric converting device in the column direction, a horizontal transfer section for transferring the charge from the vertical transfer section in the row direction, and an output section for outputting a signal corresponding to the charge to be transferred by the horizontal transfer section, wherein the vertical transfer section includes a vertical transfer channel and a plurality of vertical transfer electrodes provided on an upper layer of the vertical transfer channel, the vertical transfer channel includes a first portion provided on a side of each of the photoelectric converting devices constituting the corresponding photoelectric converting device string and a second portion provided between the photoelectric converting devices and wholly has a shape of a comb, the vertical transfer electrode includes a first vertical transfer electrode having a first conductive layer formed on the upper layer of the vertical transfer channel between the photoelectric converting devices and a second vertical transfer electrode having a second conductive layer formed on the upper layer of the vertical transfer channel on a side of the photoelectric converting device, and the first vertical transfer electrode and the second vertical transfer electrode corresponding to the photoelectric converting devices for the same row are driven in response to driving signals having the same phase, respectively. With such a structure, the close portions of the adjacent vertical transfer channels have no bent section. Consequently, restrictions on a design are less imposed and the charge transfer can be carried out smoothly.

In the solid-state image pick-up device according to the invention, a downstream end of the transfer channel provided below the first vertical transfer electrode is formed to be almost coincident with an end of the first portion having a small channel width which is positioned on a downstream thereof. Consequently, the storage region of the portion having a small channel width is enlarged into a portion having a great channel width. Thus, the charge transfer from the second portion to the first portion in the vertical transfer channel can be carried out smoothly.

In the solid-state image pick-up device according to the invention, a light receiving region of the photoelectric converting device has such a shape that an aspect ratio is approximately 1. With such a shape, a light concentration can be carried out efficiently by means of a microlens. By reducing shading, it is possible to avoid a reduction in a sensitivity with a small F value. The microlens can easily be designed. By changing the size of the microlens, therefore, it is possible to easily obtain an image pick-up device in which a high sensitivity pixel and a low sensitivity pixel are arranged.

DESCRIPTION OF THE PREFERRED EMBODIMENTS

Figure 1:
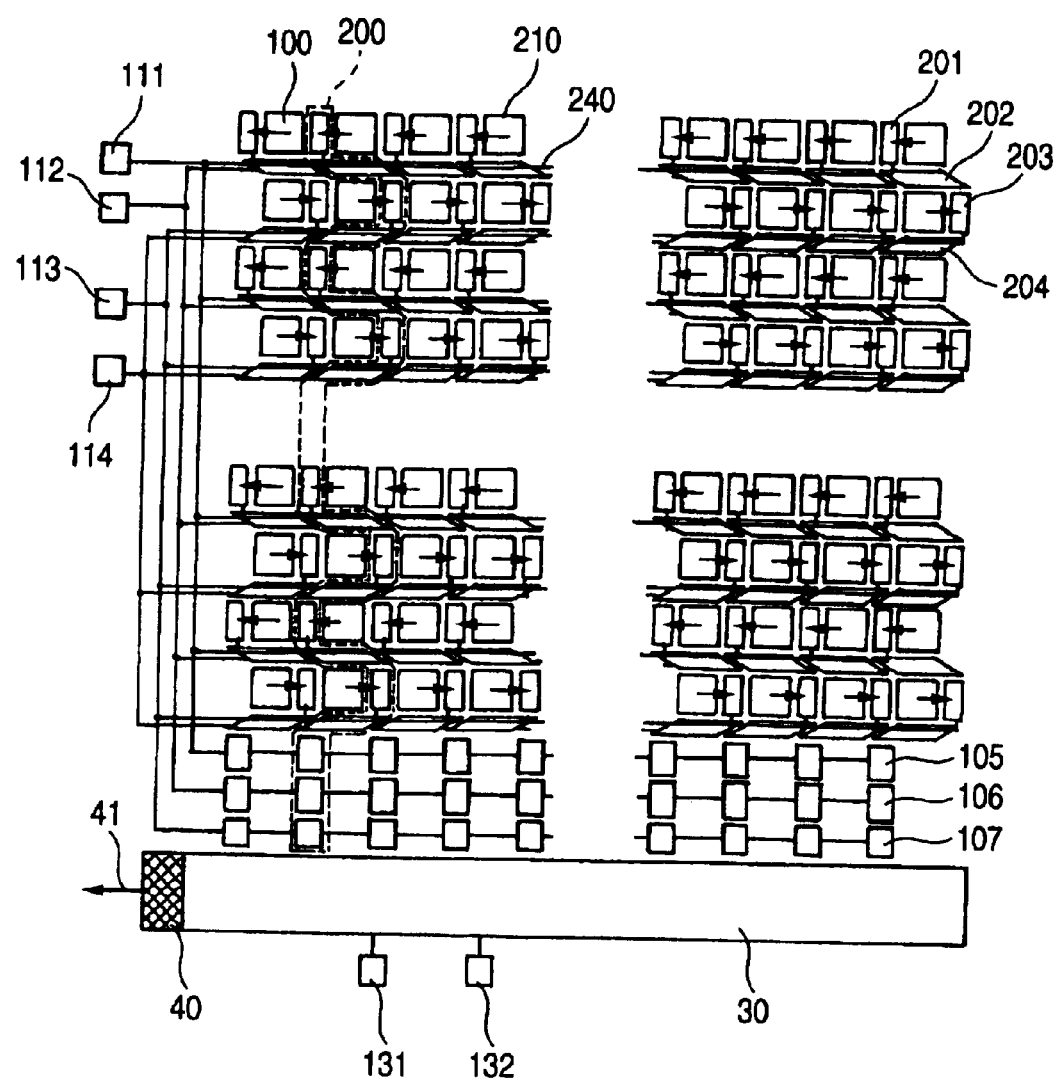
FIG. 1 is a view showing the schematic structure of a solid-state image pick-up device according to a first embodiment.
Figure 2:
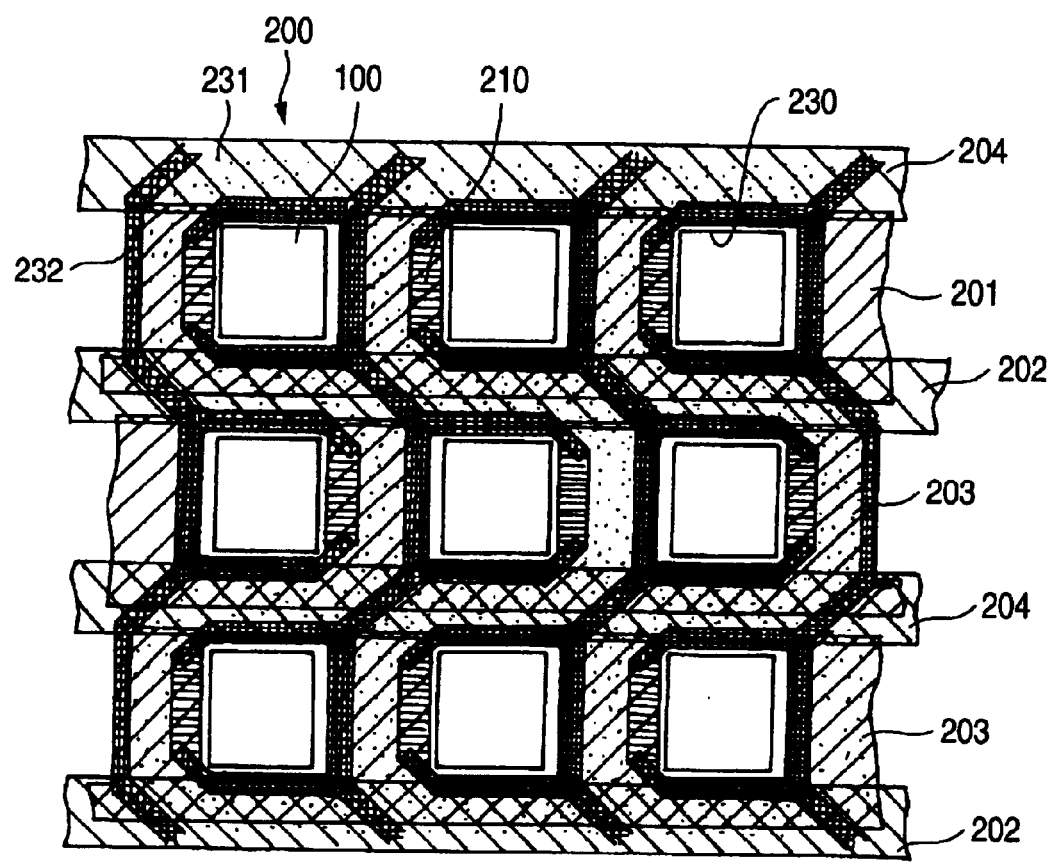
FIG. 2 is a view showing the detailed structure of the vicinity of the photoelectric converting device of the solid-state image pick-up device in FIG. 1.

FIG. 1 shows the schematic structure of a solid-state image pick-up device according to a first embodiment and FIG. 2 is a partial detailed view showing the solid-state image pick-up device in FIG. 1. In the solid-state image pick-up device of FIG. 1, a plurality of photoelectric converting devices 100 having almost square light receiving regions are provided like a tetragonal grid in a row direction X and a column direction Y orthogonal thereto over the surface of a semiconductor substrate, and a plurality of vertical transfer sections 200 are provided corresponding to a plurality of photoelectric converting device strings comprising the photoelectric converting devices 100 arranged in the column direction Y (in FIG. 1, one of the vertical transfer sections is surrounded in a broken line). The vertical transfer section 200 serves to transfer a charge from the photoelectric converting device 100 in the column direction Y and a horizontal transfer section 30 for transferring a charge from the vertical transfer section 200 in the row direction X is provided on the downstream side of the vertical transfer section 200. An output section 40 for outputting a signal corresponding to a charge to be transferred by the horizontal transfer section 30 is provided on the downstream side of the horizontal transfer section 30, and outputs a voltage signal 41 corresponding to the transferred charge. Since the structure and operation of the horizontal transfer section 30 and the output section 40 are the same as those of the conventional solid-state image pick-up device shown in FIG. 11, description will be omitted.

The vertical transfer section 200 includes a vertical transfer channel 231, a plurality of vertical transfer electrodes 201 to 204 provided on the upper layer of the vertical transfer channel 231 (only any of them corresponding to the photoelectric converting devices for two rows has the designation in FIG. 1), and a charge reading region 210 for reading the charge of the photoelectric converting device 100 onto the vertical transfer channel 231 (which is typically shown in an arrow of FIG. 1). The vertical transfer channel 231 is extended in the almost column direction Y in winding shape between the photoelectric converting devices 100 and has almost the same arrangement and shape for each photoelectric converting device string. Moreover, each vertical transfer channel 231 is separated by a channel stopper 232.

The first vertical transfer electrodes 202 and 204 including a first conductive layer formed of polycrystalline silicon are provided on the upper layer of the vertical transfer channel 231 between the photoelectric converting devices 100 which are adjacent to each other in the column direction Y. Moreover, the second vertical transfer electrodes 201 and 203 including a second conducive layer formed of polycrystalline silicon are formed on the upper layer of the vertical transfer channel 231 on the side of each photoelectric converting device 100 in order to also cover the charge reading region 210. The first vertical transfer electrodes 202 and 204 are extended almost rectilinearly between the photoelectric converting devices 100, and the second vertical transfer electrodes 201 and 203 are mutually connected through an electrode wiring 240 extended in the form of a first vertical transfer electrode. Accordingly, the first vertical transfer electrodes 202 and 204 and the second vertical transfer electrodes 201 and 203 corresponding to the photoelectric converting devices 100 in the same row can be driven in response to driving signals having the same phase, respectively.

Figure 11:
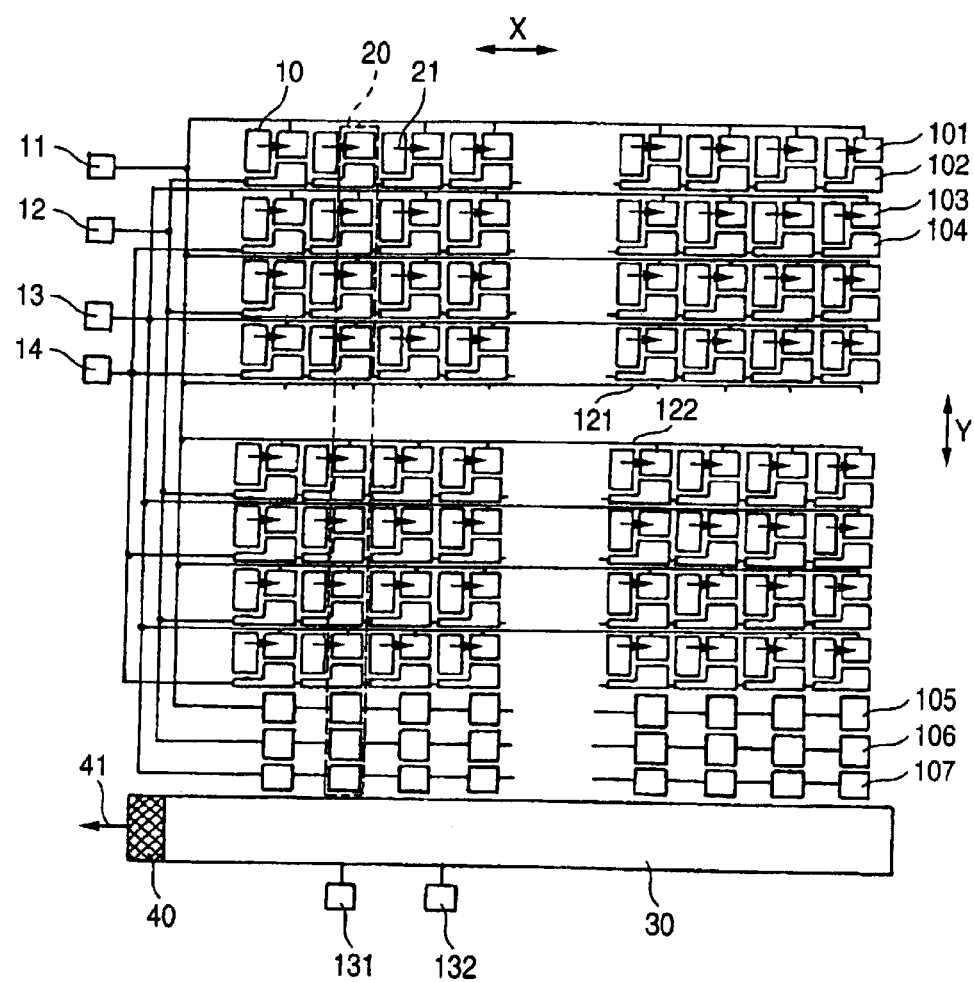
FIG. 11 is a view showing the schematic structure of an example of a conventional solid-state image pick-up device.

The driving operation of the solid-state image pick-up device in FIG. 1 is the same as that in FIG. 11, and a 4-phase vertical transfer pulse is applied to the vertical transfer electrodes 201 to 204 through terminals 111 to 114. Similarly, a 4-phase vertical transfer pulse is also applied to transfer electrodes 105, 106 and 107 between the vertical transfer section 200 and the horizontal transfer section 30. Similarly, a reading pulse is superposed on a first-phase pulse (a vertical transfer pulse to be applied to the terminal 111) in the reading operation of the photoelectric converting devices 100 for odd rows) and a third-phase pulse (a vertical transfer pulse to be applied to the terminal 113) is superposed in the reading operation of the photoelectric converting devices 100 for even rows. Since an operation to be carried out after the reading is the same as that in FIG. 11, description will be omitted.

The surface of the solid-state image pick-up device is covered with a shielding film (not shown) excluding a region surrounded by a boundary indicated as 230, and a microlens (not shown) is provided thereabove through a color filter.

Figure 3:
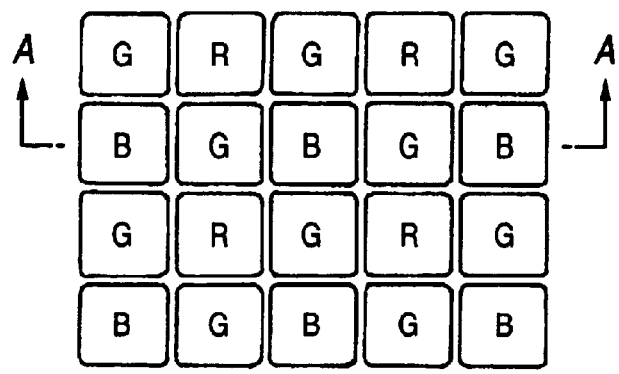
FIG. 3 is a view showing an example of a color filter to be utilized in the solid-state image pick-up device of FIG. 1.
Figure 4:
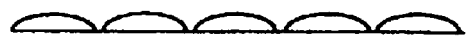
FIG. 4 is a view showing an example of a microlens to be utilized in the solid-state image pick-up device of FIG. 1.

FIG. 3 shows an example of the color filter to be utilized in the solid-state image pick-up device of FIG. 1. In FIG. 3, R, G and B indicate a red filter, a green filter and a blue filter respectively and are arranged in such a manner respective centers are coincident with the centers of the light receiving regions of the photoelectric converting devices 100. Each microlens to be provided above the color filter has almost the same size as the size of each color filter in FIG. 3 and has such a shape as to collect an incident light in the photoelectric converting device 100. FIG. 4 shows a section of a portion corresponding to A—A in FIG. 3.

(Second Embodiment)

Figure 5:
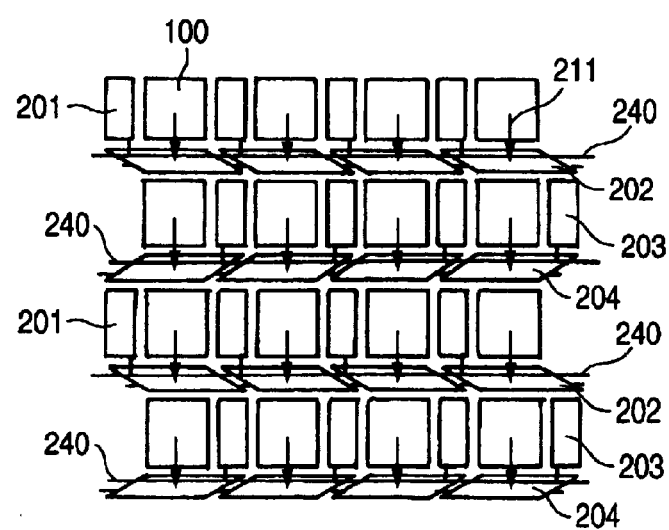
FIG. 5 is a view showing the schematic structure of a solid-state image pick-up device according to a second embodiment.

While the solid-state image pick-up device in FIG. 1 serves to read the charge of the photoelectric converting device 100 onto the vertical transfer channel 231 provided on the side thereof, it may read the charge onto the vertical transfer channel 231 provided between the photoelectric converting devices 100 which are adjacent to each other in the column direction. FIG. 5 shows the schematic structure of a solid-state image pick-up device according to a second embodiment. The solid-state image pick-up device shown in FIG. 5 is identical to the solid-state image pick-up device in FIG. 1 except that a charge reading region 211 is provided in a vertical transfer channel 231 disposed below the photoelectric converting device 100. Moreover, a driving method is identical except for a method of applying a reading pulse. The reading pulse is superposed on a second-phase pulse (a vertical transfer pulse to be applied to a terminal 112) in the reading operation of the photoelectric converting devices 100 for odd rows and is superposed on a fourth-phase pulse (a vertical transfer pulse to be applied to a terminal 114) in the reading operation of the photoelectric converting devices 100 for even rows.

(Third Embodiment)

Figure 6:
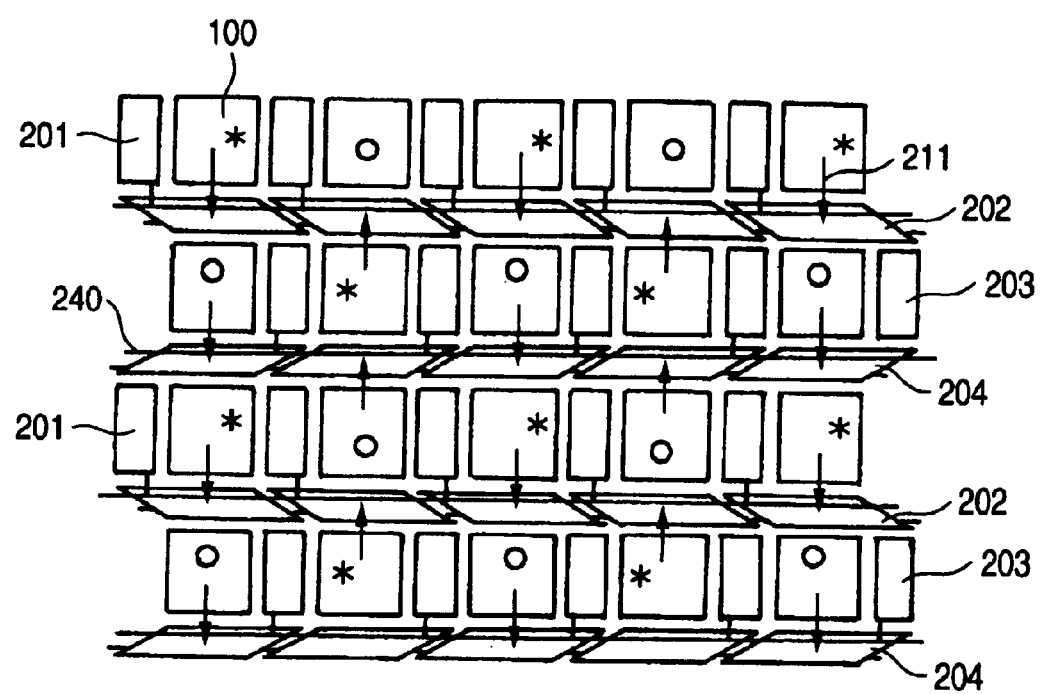
FIG. 6 is a view showing the schematic structure of a solid-state image pick-up device according to a third embodiment.

FIG. 6 shows the schematic structure of a solid-state image pick-up device according to a third embodiment. Although the solid-state image pick-up device in FIG. 6 serves to read the charges of photoelectric converting devices 100 onto a vertical transfer channel 231 provided between the photoelectric converting devices 100 which are adjacent to each other in a column direction in the same manner as the solid-state image pick-up device in FIG. 5, a reading direction is different. While the charges of all the photoelectric converting devices 100 are read in the same direction (downward in FIG. 5) in the solid-state image pick-up device shown in FIG. 5, the reading operation is changed for each column in the third embodiment. More specifically, the reading operation is carried out in the same direction for each photoelectric converting device string and the reading directions of the adjacent photoelectric converting device strings are set to be different from each other.

The driving method is basically the same as that of the solid-state image pick-up device shown in FIG. 5. More specifically, a reading pulse is superposed on a second-phase pulse (a vertical transfer pulse to be applied to a terminal 112) in a first reading operation and is superposed on a fourth-phase pulse (a vertical transfer pulse to be applied to a terminal 114) in a second reading operation. Accordingly, the charges of the photoelectric converting devices 100 having a mark "*" of FIG. 6 are read in the first reading operation and the charges of the photoelectric converting devices 100 having a mark "o" of FIG. 6 are read in the second reading operation.

With such a structure, the charges of the photoelectric converting devices provided like a checker can be read at the same time so that an operation for thinning reading a pixel can be implemented uniformly. In application to an operation for reading the charge of a solid-state image pick-up device having a high sensitivity pixel and a low sensitivity pixel arranged like a checker respectively, it is possible to read the charge of the high sensitivity pixel and the charge of the low sensitivity pixel collectively and independently.

Figure 7:
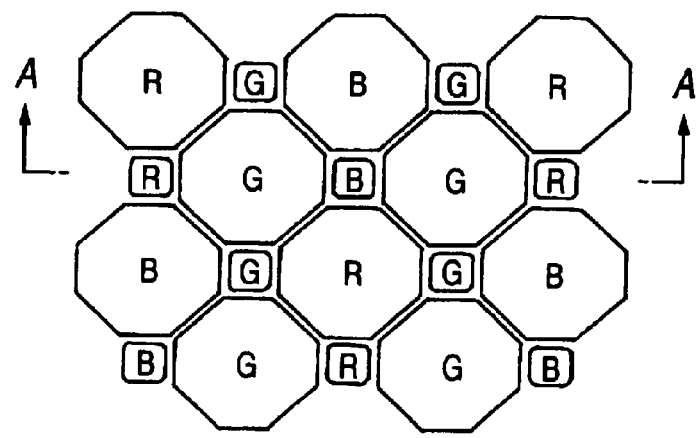
FIG. 7 is a view showing an example of a color filter to be utilized in a solid-state image pick-up device for detecting a charge through a high sensitivity pixel and a low sensitivity pixel.

FIG. 7 shows an example of a color filter to be utilized in a solid-state image pick-up device for detecting a charge by a high sensitivity pixel and a low sensitivity pixel. R, G and B in FIG. 7 indicate a red filter, a green filter and a blue filter respectively and are arranged in such a manner that respective centers are coincident with the centers of the light receiving regions of the photoelectric converting devices 100. The color filters having R, G and B surrounded by small squares are used for detecting the low sensitivity pixel and the color filters having R, G and B surrounded by octagons are used for detecting a high sensitivity pixel.

Figure 8:
FIG. 8 is a view showing an example of the section of a microlens to be utilized in the solid-state image pick-up device for detecting a charge through a high sensitivity pixel and a low sensitivity pixel.

FIG. 8 is a view showing the section of each microlens provided above the color filter in FIG. 7, and shows a section of a portion corresponding to A—A in FIG. 7. With the microlens having such a structure, a relatively small light is incident on the photoelectric converting device 100 having the low sensitivity pixel and a relatively large light is incident on the photoelectric converting device 100 having the high sensitivity pixel.

(Fourth Embodiment)

Figure 9:
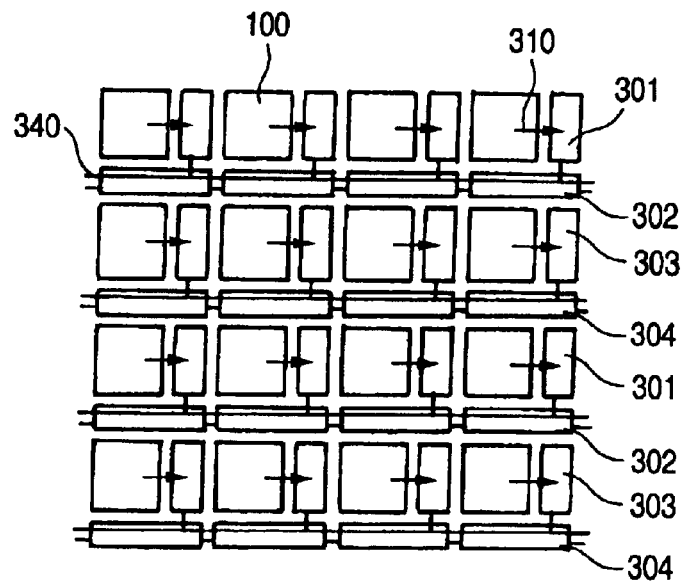
FIG. 9 is a view showing the schematic structure of a solid-state image pick-up device according to a fourth embodiment.
Figure 10:
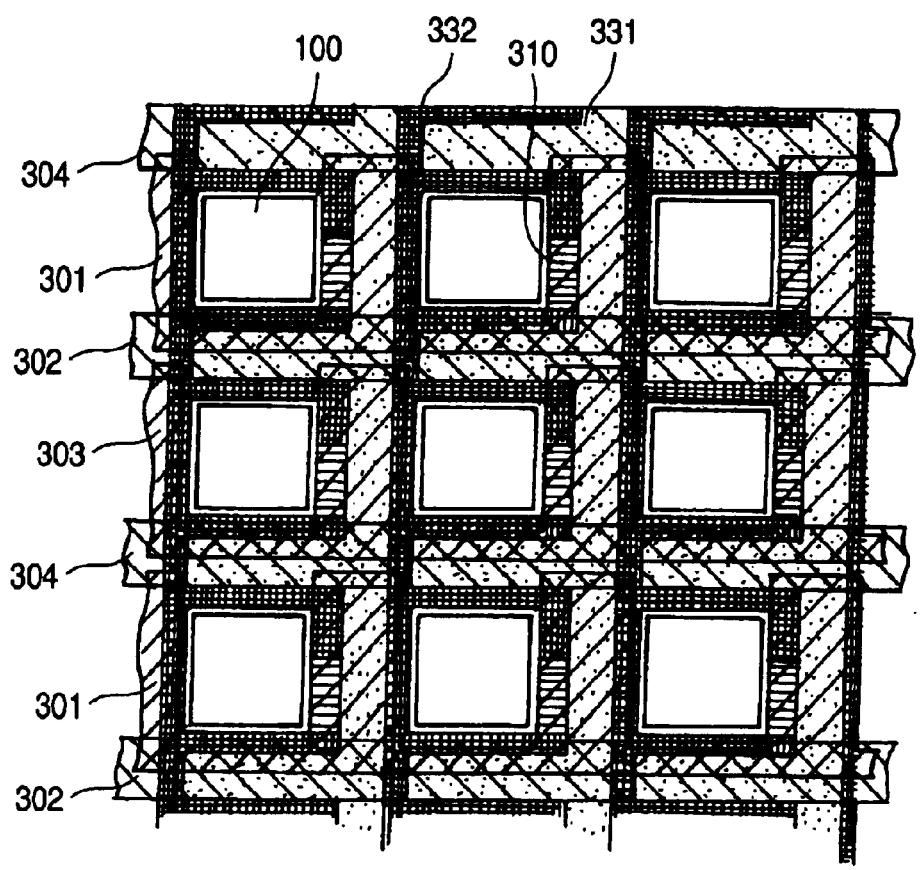
FIG. 10 is a view showing the detailed structure of the vicinity of the photoelectric converting device of the solid-state image pick-up device in FIG. 6.

FIG. 9 shows the schematic structure of a solid-state image pick-up device according to a fourth embodiment and FIG. 10 is a partial detailed view showing the solid-state image pick-up device in FIG. 9. In the solid-state image pick-up device of FIG. 9, a plurality of photoelectric converting devices 100 having almost square light receiving regions are provided like a tetragonal grid in a row direction X and a column direction Y orthogonal thereto over the surface of a semiconductor substrate, and a plurality of vertical transfer sections are provided corresponding to a plurality of photoelectric converting device strings comprising the photoelectric converting devices 100 arranged in the column direction Y respectively in the same manner as in the solid-state image pick-up devices shown in FIGS. 1, 5 and 6. The vertical transfer section serves to transfer a charge from the photoelectric converting device 100 in the column direction Y and a horizontal transfer section for transferring a charge from the vertical transfer section in the row direction X is provided on the downstream side of the vertical transfer section. An output section for outputting a signal corresponding to a charge to be transferred by the horizontal transfer section is provided on the downstream side of the horizontal transfer section, and outputs a voltage signal corresponding to the transferred charge. Since the structure and operation of the horizontal transfer section and the output section are the same as those of the conventional solid-state image pick-up device shown in FIG. 11 and the solid-state image pick-up devices shown in FIGS. 1, 5 and 6, description will be omitted.

The vertical transfer section includes a vertical transfer channel 331, a plurality of vertical transfer electrodes 301 to 304 provided on the upper layer of the vertical transfer channel 331, and a charge reading region 310 for reading the charge of the photoelectric converting device 100 onto the vertical transfer channel 331 (which is typically shown in an arrow of FIG. 9). The vertical transfer channel 331 includes a first portion provided on the side of each photoelectric converting device 100 constituting a corresponding photoelectric converting device string and a second portion provided between the photoelectric converting devices, and wholly takes the shape of a comb. The vertical transfer channel 331 has almost the same arrangement and shape for each photoelectric converting device string and is separated by a channel stopper 332.

The second vertical transfer electrodes 301 and 303 including a second conductive layer formed of polycrystalline silicon are formed on the upper layer of the first portion of the vertical transfer channel 331 in order to also cover the charge reading region 310. Moreover, the first vertical transfer electrodes 302 and 304 including a first conducive layer formed of polycrystalline silicon are formed on the upper layer of the second portion of the vertical transfer channel 331. The first vertical transfer electrodes 302 and 304 are extended almost rectilinearly between the photoelectric converting devices 100, and the first vertical transfer electrodes 301 and 303 are mutually connected through an electrode wiring 340 extended in a row direction above the second vertical transfer electrode. Accordingly, the first vertical transfer electrodes 302 and 304 and the second vertical transfer electrodes 301 and 303 corresponding to the photoelectric converting devices 100 for the same row can be driven in response to a driving signal having the same phase, respectively.

Moreover, the position of the transfer channel 331 on a boundary between the first vertical transfer electrodes 304 and 302 and the second vertical transfer electrodes 301 and 303 provided on the downstream side thereof is set to be almost coincident with the end of the first portion having a small channel width. With such formation, storage regions in the portions having small channel widths which are provided below the second vertical transfer electrodes 301 and 303 are slightly extended up to storage regions in portions having great channel widths which are provided below the first vertical transfer electrodes 304 and 302 so that a charge transfer from the second portion to the first portion in the vertical transfer channel can be carried out smoothly.

The driving operation of the solid-state image pick-up device in FIG. 9 is the same as that of each of the solid-state image pick-up devices shown in FIGS. 1, 5 and 6, and a 4-phase vertical transfer pulse is applied to the vertical transfer electrodes 301 to 304 through terminals for four vertical transfer pulses (not shown). Similarly, a reading pulse is superposed on a first-phase pulse to be applied to the vertical transfer electrode 301 in the reading operation of the photoelectric converting devices 100 for odd rows and is superposed on a third-phase pulse to be applied to the vertical transfer electrode 303 in the reading operation of the photoelectric converting devices 100 for even rows. Since an operation to be carried out after the reading is the same as the operations of the solid-state image pick-up devices shown in FIGS. 1, 5 and 6, description will be omitted.

As described above, the light receiving region of the photoelectric converting device 100 of the solid-state image pick-up device according to each of the first to fourth embodiments has an almost square shape and can be arranged like a tetragonal grid. Therefore, a color filter and a microlens can easily be designed and a collection efficiency can also be enhanced. Consequently, a sensitivity can further be increased. While the light receiving region of the photoelectric converting device has a square shape, it is possible to take any shape having an aspect ratio of approximately 1, for example, a regular hexagon, a regular octagon or a circle.

[Advantage of the Invention]

As is apparent from the above description, according to the invention, it is possible to provide a solid-state image pick-up device having a simple structure in which the ratio of the areas of a photoelectric converting device and a vertical transfer channel to the area of a whole image pick-up section can be increased to obtain a great saturation output with a high sensitivity.

What is claimed is:

1. A solid-state image pick-up device having a plurality of photoelectric converting devices arranged like a tetragonal grid in a row direction and a column direction orthogonal thereto over a surface of a semiconductor substrate, comprising:

a plurality of vertical transfer sections provided corresponding to a plurality of photoelectric converting device strings having the photoelectric converting devices arranged in the column direction respectively and serving to transfer a charge of the photoelectric converting device in the column direction;

a horizontal transfer section for transferring the charge from the vertical transfer section in the row direction; and an output section for outputting a signal corresponding to the charge to be transferred by the horizontal transfer section, wherein the vertical transfer section includes a vertical transfer channel and a plurality of vertical transfer electrodes provided on an upper layer of the vertical transfer channel, the vertical transfer channel is provided in winding shape between the photoelectric converting devices constituting the corresponding photoelectric converting device string, the vertical transfer electrode includes a first vertical transfer electrode having a first conductive layer formed on the upper layer of the vertical transfer channel between the photoelectric converting devices and a second vertical transfer electrode having a second conductive layer formed on the upper layer of the vertical transfer channel on a side of the photoelectric converting device, and the first vertical transfer electrode and the second vertical transfer electrode corresponding to the photoelectric converting devices for the same row are driven in response to driving signals having the same phase, respectively.

2. The solid-state image pick-up device according to claim 1, wherein the vertical transfer channel is formed with the same arrangement and shape for the photoelectric converting device strings.

3. The solid-state image pick-up device according to claim 1 or 2, wherein a charge reading region for reading the charge of the photoelectric converting device onto the vertical transfer channel is formed in contact with the vertical transfer channel on the side of the photoelectric converting device.

4. The solid-state image pick-up device according to claim 1 or 2, wherein a charge reading region for reading the charge of the photoelectric converting device onto the vertical transfer channel is formed in contact with the vertical transfer channel between the photoelectric converting devices.

5. The solid-state image pick-up device according to claim 4, wherein a position of the charge reading region with respect to the photoelectric converting device is identical for each of the photoelectric converting device strings and the positions of the photoelectric converting device strings which are adjacent to each other are different from each other.

6. The solid-state image pick-up device according to claim 5, wherein two kinds of collecting microlenses having different collection ratios are provided corresponding to each of the photoelectric converting devices, and the two kinds of microlenses are provided like a checker, respectively.

7. A solid-state image pick-up device having a plurality of photoelectric converting devices arranged like a tetragonal grid in a row direction and a column direction orthogonal thereto over a surface of a semiconductor substrate, comprising:

a plurality of vertical transfer sections provided corresponding to a plurality of photoelectric converting device strings having the photoelectric converting devices arranged in the column direction respectively and serving to transfer a charge of the photoelectric converting device in the column direction;

a horizontal transfer section for transferring the charge from the vertical transfer section in the row direction; and an output section for outputting a signal corresponding to the charge to be transferred by the horizontal transfer section, wherein the vertical transfer section includes a vertical transfer channel and a plurality of vertical transfer electrodes provided on an upper layer of the vertical transfer channel, the vertical transfer channel includes a first portion provided on a side of each of the photoelectric converting devices constituting the corresponding photoelectric converting device string and a second portion provided between the photoelectric converting devices and wholly has a shape of a comb, the vertical transfer electrode includes a first vertical transfer electrode having a first conductive layer formed on the upper layer of the vertical transfer channel between the photoelectric converting devices and a second vertical transfer electrode having a second conductive layer formed on the upper layer of the vertical transfer channel on a side of the photoelectric converting device, and the first vertical transfer electrode and the second vertical transfer electrode corresponding to the photoelectric converting devices for the same row are driven in response to driving signals having the same phase, respectively.

8. The solid-state image pick-up device according to claim 7, wherein a downstream end of the transfer channel provided below the first vertical transfer electrode is formed to be almost coincident with an end of the first portion having a small channel width which is positioned on a downstream thereof.

9. The solid-state image pick-up device according to claim 1 or 7, wherein a light receiving region of the photoelectric converting device has such a shape that an aspect ratio is approximately 1.

* * * * *